United States Patent [19]
Rollender et al.

[11] Patent Number: 5,824,571
[45] Date of Patent: Oct. 20, 1998

[54] MULTI-LAYERED CONTACTING FOR SECURING INTEGRATED CIRCUITS

[75] Inventors: Matthew Rollender, Gilbert; Ray Hirt, Mesa, both of Ariz.

[73] Assignee: Intel Corporation, Santa Clara, Calif.

[21] Appl. No.: 575,295

[22] Filed: Dec. 20, 1995

[51] Int. Cl.[6] .................................................. H01L 21/82
[52] U.S. Cl. ......................................... 438/130; 438/455
[58] Field of Search ............................ 257/922; 438/130, 438/455–460

[56] References Cited

U.S. PATENT DOCUMENTS

| | | |
|---|---|---|
| 3,725,671 | 4/1973 | Keister et al. . |
| 4,612,083 | 9/1986 | Yasumoto et al. . |
| 4,933,898 | 6/1990 | Gilberg et al. . |
| 4,956,749 | 9/1990 | Chang ..................................... 361/414 |
| 5,644,638 | 7/1997 | Thiriet ....................................... 380/25 |

Primary Examiner—Jey Tsai
Attorney, Agent, or Firm—Blakely, Sokoloff, Taylor & Zafman

[57] ABSTRACT

A method for securing confidential circuitry from observation by unauthorized inspection, and a secure circuit immune from unauthorized inspection according to the method. In one embodiment, confidential data or circuitry is placed on a face of separate silicon layers, each silicon layer having part of a circuit. Neither silicon layer is intelligible without the other, yet neither can be observed without destroying the other. The two silicon layers are juxtaposed, the face of the first silicon layer flush against and fused to the face of the second silicon layer, the confidential circuits on each silicon layer connecting directly with circuits on the other silicon layer without external connectors. Data stored on each face is erased or destroyed when the silicon layers are separated or one of the silicon layers is destroyed. Violence to either silicon layer of silicon, or exposure of either silicon layer of silicon to light, destroys the data or circuitry on at least one silicon layer of silicon, making the data or circuitry unreadable.

6 Claims, 6 Drawing Sheets

MULTI-LAYERED CONTACTING FOR SECURING INTEGRATED CIRCUITS

FIELD OF THE INVENTION

The present invention relates to the field of secure data storage devices; more particularly, the present invention relates to secure semiconductor device layers.

BACKGROUND OF THE INVENTION

Information piracy and information theft are growing problems in the information age. Vulnerability of personal, financial, and medical information stored electronically concerns hospitals, banks and other financial institutions, employers and insurers as well as private individuals. Compounding the problem is the fact that many items of personal information, such as passport number, social security number, driver's license number, and mother's maiden name, are used as passwords to access other databases. In other words, once one security device is breached, others are made easier to breach. Learning even some of a potential victim's personal information can further a criminal's goal of transferring or withdrawing funds from the victim's account, ordering unauthorized credit cards, and in some cases stealing whole identities.

Theft of corporate business and technological proprietary information is also a growing problem. In business, unscrupulous competitors and contractors, and even outside investors, have an incentive to steal proprietary information, to learn corporate business strategies or to gain unfair advantage in business negotiations. Also, in the software and electronics industries, unscrupulous engineers unable to overcome a technological problem solved by a competitor may attempt to learn the competitor's technological secrets by reverse-engineering a semiconductor chip such as a GaAs integrated circuit chip or a silicon chip.

Furthermore, more conventional thieves are learning to overcome electronic security measures by counterfeiting "chip cards", access cards, electronic badges, and name tags which typically include one or more integrated circuits. As the use of such silicon devices to control access to buildings becomes more common, the incentives to counterfeit such access devices can also be expected to grow.

Finally, easy inspection of electronic devices has serious repercussions for the defense industry. A military enemy who can inspect captured electronic devices containing classified information can damage national security.

Thus, a better way to store information in semiconductor devices, such as silicon integrated circuits, tamper-free and intrusion-free, is needed.

SUMMARY OF THE INVENTION

A method for securing confidential circuitry (e.g., an integrated circuit containing confidential information) from observation by unauthorized inspection, and a secure circuit immune from unauthorized inspection according to the method, are disclosed. Confidential data or circuitry is distributed between two separate integrated circuit layers or die, each layer having part of a circuit that is unintelligible without the part of the circuit on the other layer, yet neither part can be observed directly without destroying the other layer. The two integrated circuit (IC) layers are connected directly, the face of the first IC layer facing and attached to the face of the second IC layer, the confidential circuits on each silicon layer connecting directly with circuits on the other silicon layer without external connectors extending outside of the package holding the ICs. Data stored on each face is erased or destroyed when the IC layers are separated or one of the IC layers is destroyed. Violence to either IC layer, or exposure of either IC layer to light, destroys the data or circuitry on at least one IC layer, making the data or circuitry unreadable.

In some embodiments, the invention is extended to a stack of IC's, such as a stack of silicon layers, portions of each circuit being distributed over a number of silicon layers. Silicon layers sharing such circuits are connected directly, a portion of a face of each silicon layer being connected to a portion of an adjacent silicon layer with which the circuits are shared.

According to the present invention, a confidential layer of silicon is shielded from inspection by another layer of silicon, and silicon layer may be observed without destroying or damaging an adjacent layer of silicon. There is nothing to cut or burn away except silicon layers containing additional portions of confidential circuitry. Thus, circuits receive a higher degree of protection and security than prior technology can provide.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

A secure semiconductor device is described. In the following description, numerous details are set forth, such as distances between components, types of molding, etc. It will be apparent, however, to one skilled in the art, that the present invention may be practiced without these specific details. In other instances, well-known structures and devices are shown in block diagram form, rather than in detail, in order to avoid obscuring the present invention.

Figure 1:
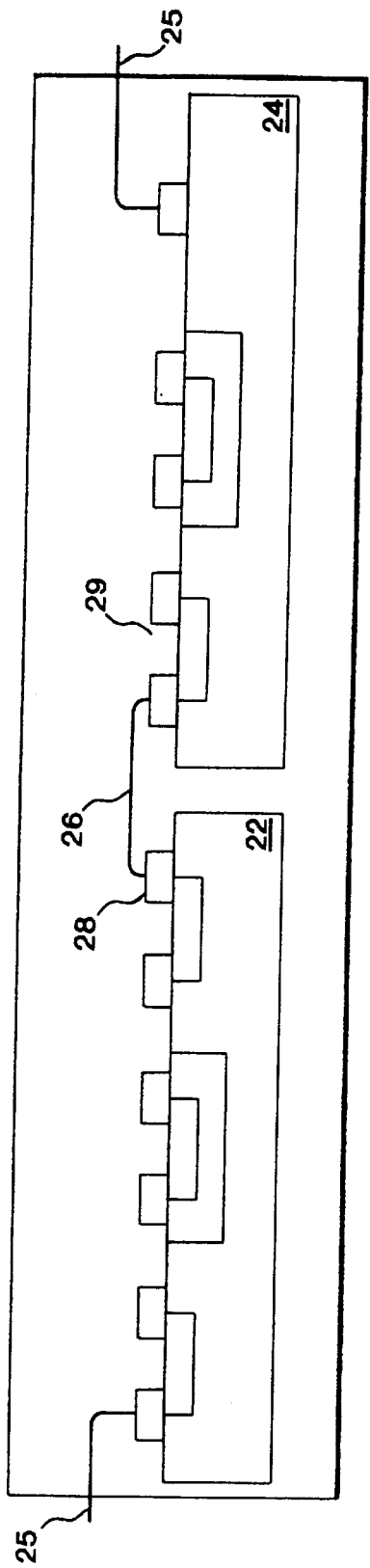
FIG. 1 shows a prior art security device.

Referring now to FIG. 1, a prior art security device is shown. A first silicon layer 22 containing confidential electronic data or coded circuitry is connected to a second silicon layer 24, similarly containing confidential electronic data or coded circuitry, by connectors 26. A connector 26 is attached to one or more terminals 28 and 29 on each silicon layer 22 and 24. The silicon layers 22 and 24 are designed with some security measures intended to confound unauthorized examination. Processing functions are distributed throughout each silicon layer 22 and 24 so that the actual circuitry is more difficult to understand, and some circuitry is present on the silicon layers 22 and 24 that serves no useful function other than to confuse undesired inspection. In the prior art package shown in FIG. 1, the two silicon layers 22 and 24 and the connector 26 are surrounded by a protective layer 30 of hardened yet brittle material that protects the silicon layers 22 and 24 from light and physical disruption. Due to the brittleness of the protective layer 30, the silicon layers 22 and 24 themselves are destroyed when any significant violence is done to the package, including cutting or burning away of the protective layer 30.

These measures, while making inspection more difficult, do not eliminate the risk of unauthorized physical, electronic, or chemical examination of the circuits on the silicon layers 22 and 24; the prior art device shown in FIG. 1 is in fact not secure. Unintended intrusion into the device may be accomplished either physically or chemically. An intruder may physically cut away, or chemically burn away, the protective layer 30. Either may be accomplished in a darkened environment, to prevent light-sensitive circuits from being destroyed in the light. Such removal of the protective layer 30 results in exposure of the terminals 28 and 29 of each silicon layer 22 and 24, thus allowing electronic testing, and may expose the entire surface of the silicon layer, allowing visual inspection (by electron microscope) of all or nearly all electronic traces on the surface of the silicon layer.

Figure 2:
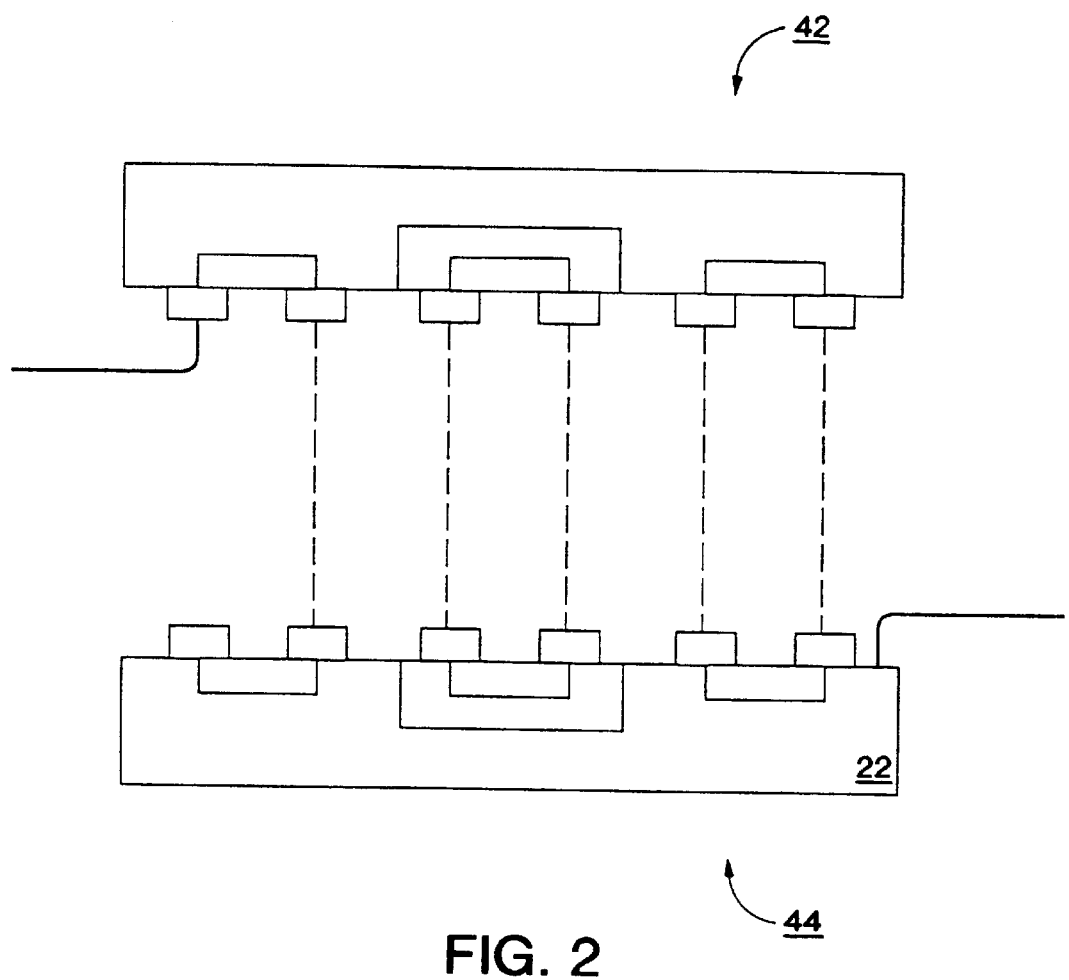
FIG. 2 shows a device in accordance with the present invention.

Referring now to FIG. 2, a device in accordance with one embodiment of the present invention is shown. Circuitry is fabricated on a top silicon layer 42 and lower silicon layer 44, which are fused without external connectors, such that the two layers communicate directly with each other. It is noted that silicon is used as an example and not by way of limitation, and any semiconductor device such as GaAs may be used. The topology of the circuitry residing on either silicon layer cannot be examined without destruction of at least part of the other silicon layer. In one implementation, the logic on the top silicon layer 42 unscrambles the signals on the lower silicon layer 44. In another implementation, each silicon layer contains logic to unscramble signals from the other. There need be no protective layer 30: each silicon layer protects the other from inspection. Electron microscopes cannot penetrate either silicon layer to examine the other. Both silicon layers may have active circuitry; or the device may be implemented with active circuitry on one of the layers, and mere interconnects or decoders on the other. Furthermore, if the confidential material happens to be in software, an unauthorized examination cannot simply move the software to another chip and examine it there; software or data stored on one silicon layer would be useless without the actual logic circuitry implemented on the other silicon layer. Secret keys implemented on one or both of the silicon layers are destroyed when the devices are split apart, when the connected surfaces are split apart or exposed to light or air. The silicon layers are useless without the keys.

In some embodiments of the present invention as presented in FIG. 2, at least one die maintains a code, implemented in either hardware or software, and communicates the code to the circuitry on the other die. The circuitry receiving the code is implemented such that operation is impossible without receipt of the code, and such that interruption of the code causes irretrievable loss of information. Unauthorized examination of the dies cannot be accomplished by simply moving software protected according to the present invention to another chip for examination there; software or data stored on one silicon layer would be useless without the actual logic circuitry implemented on at least one other silicon layer. Secret keys implemented on one or more of the silicon layers are destroyed when the devices are split apart, and the silicon layers are useless without the keys. Alternatively, the first die may contain circuitry that generates an interrupt signal when the dies are disconnected, the interrupt signal destroying information or circuitry on the second die. As a third alternative, also illustrated in FIG. 6, the first die alters a voltage at a terminal in the second die, generating a destruct function in the second die.

The secret keys may be implemented on one of the silicon layers, or may be split such that part of the secret key appears on each silicon layer, and may reside in several locations on the silicon layers. One possible implementation for the secret keys would include a first function on one silicon layer that generates random codes, while on the second silicon layer the random codes are received, translated, and supplied to the first silicon layer, where the translated code is compared with the initial random code, any interruption of the code transfer being indicative of a breach in the security of the layers.

Figure 3:
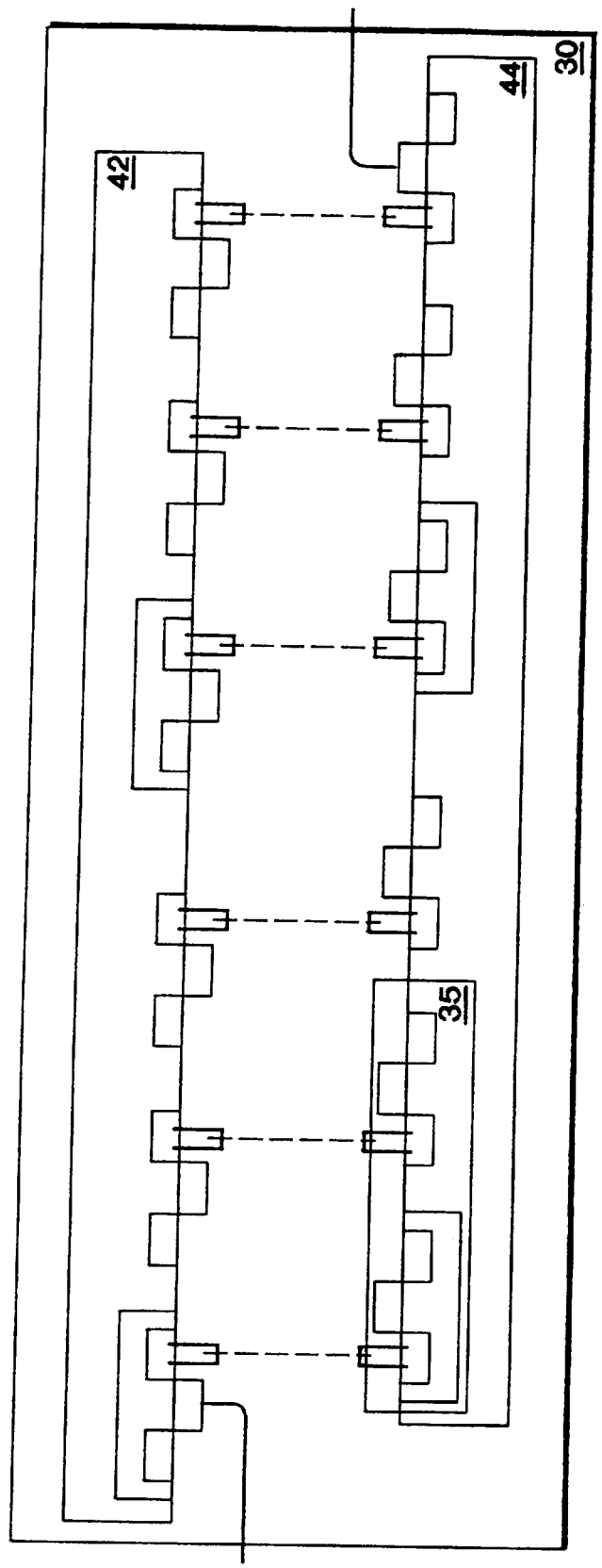
FIG. 3 shows a second embodiment of the present invention having protective layers.

FIG. 3 illustrates an embodiment of the present invention in which at least one circuit on at least one die contains EPROMs, EEPROMs, or Flash EPROMs. Because EPROMs 35 are at least partially erased when exposed to light, and in particular ultraviolet light, confidential information stored in the EPROMs 35 can be made secure by ensuring that the EPROMs 35 are exposed to light whenever the topology of the semiconductor layer containing the EPROM 35 is separated from the other layer. In some embodiments, rather than storing confidential information in the EPROMs 35, the circuit stores a code in the EPROMs 35 that prevents erasure of data or destruction of a circuit while the EPROMs 35 retains the code. In these latter embodiments, exposing the EPROM 35 to light erases the code from the EPROM 35 and thereby creates a reaction within the circuits that either erases other data or destroys circuits on at least one of the layers.

Figure 4:
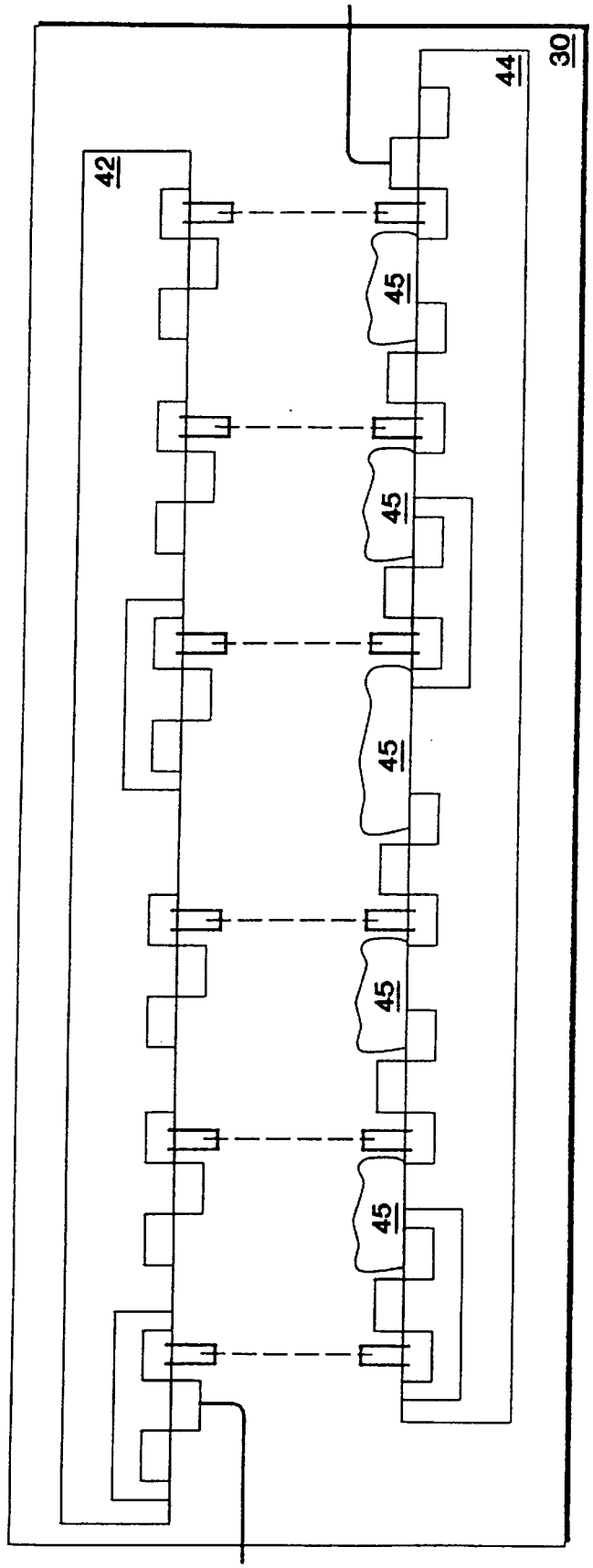
FIG. 4 shows a third embodiment of the present invention, in which the reactive layer is placed between the two dies.

Referring now to FIG. 4, an embodiment of the present invention is shown in which a glass or silicon material layer is placed between the silicon dies. The glass or silicon material is of a composition such that virtually any material that might burn or corrode the surface of the silicon die would also react in a destructive way with the glass or silicon material. According to the embodiment presented in FIG. 4, intrusive burning away of the glass or silicon material in an attempt to observe the topology of the first or second silicon layers would result in the destruction of the silicon layers themselves. In some embodiments, the glass or silicon material is porous, thereby allowing any acid or other corrosive material placed on the glass or silicon material to be conveyed to the topology of the circuit itself. It will be recognized that the glass or silicon material will be replaced with other materials chemically similar to a Gallium Arsenide substrate when the present invention is used in conjunction with Gallium Arsenide semiconductor circuitry, and will be replaced with other materials as other types of integrated circuitry are used. Thus, when a burning, acidic, or corrosive invasion of the material placed around one or both integrated circuit layers, or placed between two integrated circuit layers, occurs substantial damage will also occur to the semiconductor layers themselves.

Figure 5:
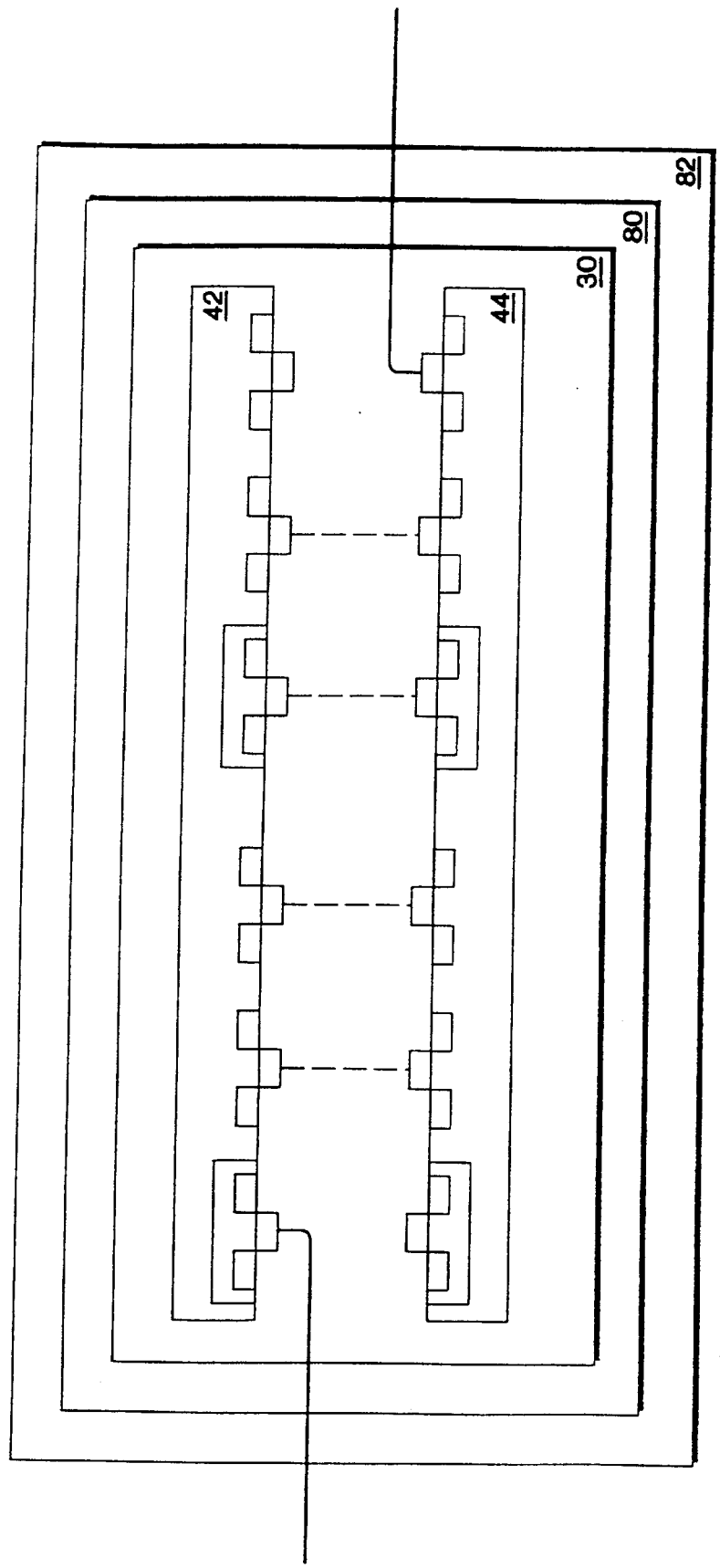
FIG. 5 shows an embodiment of the present invention in which protective layers are added for security.

Referring now to FIG. 5, an embodiment of the present invention is illustrated in which protective layers are added for further security. A pair of semiconductor dies, each having circuitry residing on a face of the die juxtaposed and connected with the circuitry on the face of the other die, are surrounded by several layers of a protective envelope. The inner layer 30 of the protective envelope is similar to the hardened, brittle material known in the prior art, protecting the silicon from direct observation, and also from degradation that might otherwise be caused by a reactive layer 80.

Reactive layer 80 reacts volatilely with air or other atmospheric gases, destroying the circuitry on the dies. Reactive layer 80 is prevented from coming into contact with the air or other atmospheric gases by a second protective layer 82 that is sturdy enough to protect the circuits during shipping, installation, use and maintenance of the dies.

Figure 6:
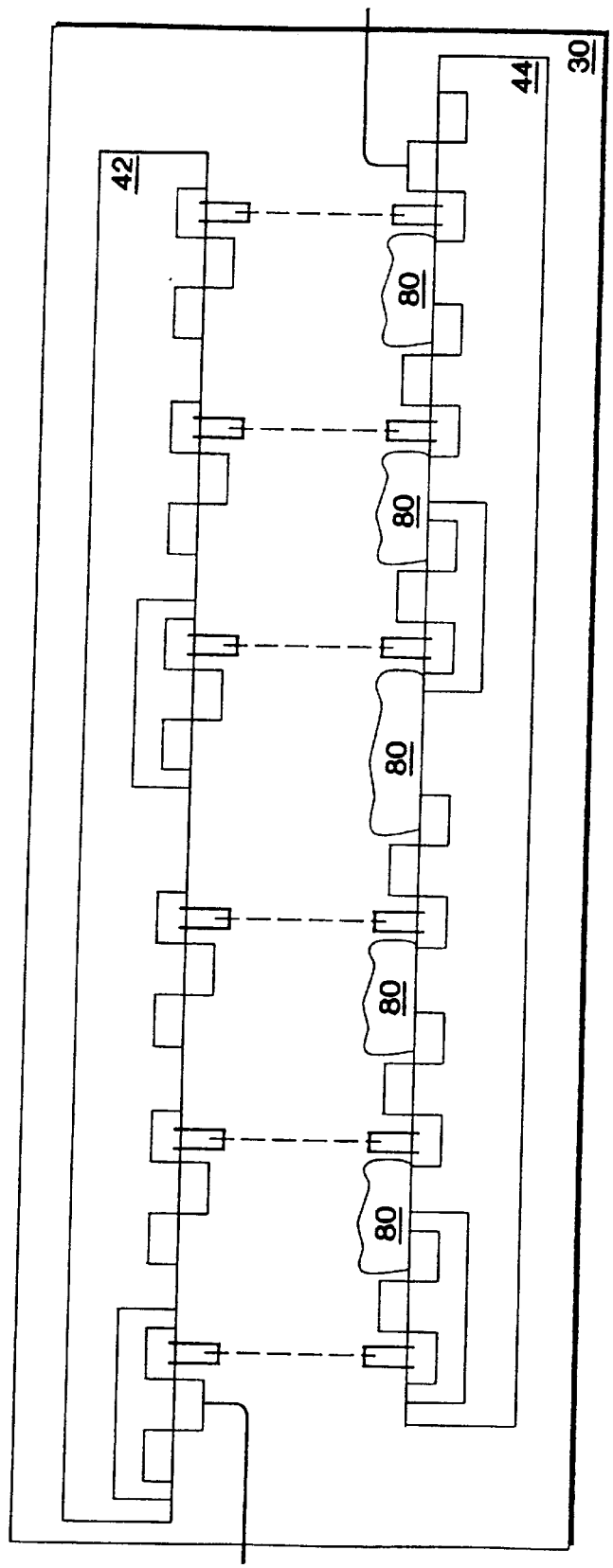
FIG. 6 is an embodiment of the present invention in which a reactive layer is placed between two dies.

Referring now to FIG. 6, an third embodiment of the present invention is presented, in which the reactive layer 80 is placed solely between the two dies. In the embodiment presented in FIG. 6, the reactive layer 80 is of a chemical composition that does not react with the circuitry, or substrate of the silicon dies 42 and 44. A protective layer 80 insulates the dies from damage that might otherwise occur during transportation and installation of the dies.

It will be noted with respect to FIGS. 3 and 4 that, if a reactive layer 80 is of a chemical composition that does not react in any way with any part of the silicon layer or the topology of the circuit fabricated thereon, the inner layer 30 may be omitted. Furthermore, if the reactive layer is of a composition that would react with only part of the silicon layer but would not react with other parts of the silicon layer, then only those parts that would be affected by the reactive layer 80 need be protected by part of the inner layer 30. Furthermore, the entire reactive layer may be inert, obviating the need for the inner layer 30.

We claim:

1. A method for forming a plurality of integrated circuits comprising the steps of:

fabricating first circuitry on a face of a first semiconductor layer;

fabricating second circuitry on a face of a second semiconductor layer;

juxtaposing the face of the first semiconductor layer to the face of the second semiconductor layer, said juxtaposition directly connecting the first circuitry to the second circuitry, the face of first semiconductor layer and the face of said second semiconductor layer in direct surface contact with one another.

2. The method as set forth in claim 1, wherein said second circuitry comprises one of active support circuitry or passive support circuitry.

3. The method as set forth in claim 1, wherein substantial violence to a layer, or exposure of a juxtaposed face of a layer to light, destroys said layer or said face.

4. A method for securing confidential circuitry from observation by unauthorized inspection, comprising the steps of:

placing first circuitry on a face of a first semiconductor layer;

placing second circuitry on a face of a second semiconductor layer;

covering the face of the first semiconductor layer with the face of the second semiconductor layer, said covering directly connecting the first circuitry to the second circuitry the face of the first semiconductor layer directly contacting the face of the second semiconductor layer.

5. A method for securing confidential circuitry from observation by unauthorized inspection as set forth in claim 4, further comprising the step of:

placing a chemical composition in-between or surrounding the semiconductor layers such that the placed chemical composition transitions to another chemical composition when the layers are separated from one another.

6. A method for securing confidential circuitry from observation by unauthorized inspection as set forth in claim 5, wherein the transition of the placed chemical composition to another chemical composition damages or destroys at least part of at least one of the layers.

* * * * *